(12) United States Patent
Montena

(10) Patent No.: US 11,621,533 B2
(45) Date of Patent: Apr. 4, 2023

(54) OUTER SLEEVE FOR CATV FILTER

(71) Applicant: PPC BROADBAND, INC., East Syracuse, NY (US)

(72) Inventor: Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 333 days.

(21) Appl. No.: 16/567,363

(22) Filed: Sep. 11, 2019

(65) Prior Publication Data

US 2020/0006908 A1 Jan. 2, 2020

Related U.S. Application Data

(63) Continuation of application No. 15/340,452, filed on Nov. 1, 2016, now Pat. No. 10,424,893, which is a continuation of application No. 14/013,797, filed on Aug. 29, 2013, now Pat. No. 9,516,774, which is a continuation of application No. 11/467,247, filed on Aug. 25, 2006, now Pat. No. 8,545,235.

(51) Int. Cl.
| | |
|---|---|
| *B23P 19/00* | (2006.01) |
| *H05K 13/04* | (2006.01) |
| *H01R 43/26* | (2006.01) |
| *H01R 24/42* | (2011.01) |
| *G01L 3/02* | (2006.01) |
| *H05K 5/04* | (2006.01) |
| *H01R 103/00* | (2006.01) |
| *H04N 7/10* | (2006.01) |

(52) U.S. Cl.
CPC ............ *H01R 43/26* (2013.01); *G01L 3/02* (2013.01); *H01R 24/42* (2013.01); *H05K 5/04* (2013.01); *H01R 2103/00* (2013.01); *H04N 7/102* (2013.01)

(58) Field of Classification Search
CPC . H05K 5/04; G01L 3/02; H01R 43/26; H01R 24/42; H01R 2103/00; H04N 7/102
See application file for complete search history.

(56) References Cited

U.S. PATENT DOCUMENTS

| | | | |
|---|---|---|---|
| 2,777,998 A | | 1/1957 | Shepard |
| 4,291,936 A | | 9/1981 | Oldfield et al. |
| 4,451,803 A | * | 5/1984 | Holdsworth ......... H03H 1/0007 333/12 |
| 4,701,726 A | | 10/1987 | Holdsworth |
| 4,773,880 A | | 9/1988 | Sutton et al. |
| 5,150,087 A | | 9/1992 | Yoshie et al. |

(Continued)

FOREIGN PATENT DOCUMENTS

| | | |
|---|---|---|
| WO | 2004/045072 A1 | 5/2004 |
| WO | 2005/029665 A2 | 3/2005 |

(Continued)

*Primary Examiner* — Paul D Kim
(74) *Attorney, Agent, or Firm* — MH2 Technology Law Group LLP

(57) ABSTRACT

A torque transmitter includes a filter header configured to support a filter component. The torque transmitter also includes a torque-transmitting housing configured to at least partially enclose the filter header. The torque-transmitting housing is configured to receive a torque force from an installation tool, and to transmit the torque force to the filter header.

26 Claims, 3 Drawing Sheets

(56) References Cited

U.S. PATENT DOCUMENTS

| | | | |
|---|---|---|---|
| 5,278,525 A * | 1/1994 | Palinkas | H03H 1/00 333/175 |
| 5,432,488 A | 7/1995 | Kotani et al. | |
| 5,662,494 A | 9/1997 | Zennamo, Jr. et la. | |
| 6,273,766 B1 | 8/2001 | Zennamo, Jr. et al. | |
| 6,323,743 B1 * | 11/2001 | Zelenz | H01R 13/5213 333/172 |
| 6,636,129 B2 | 10/2003 | Zennamo, Jr. et al. | |
| 6,674,343 B2 | 1/2004 | Gould et al. | |
| 6,683,773 B2 | 1/2004 | Montena | |
| 6,737,925 B1 | 5/2004 | Logue et al. | |
| 6,737,935 B1 | 5/2004 | Shafer | |
| 6,784,760 B2 | 8/2004 | Olcen et al. | |
| 6,794,957 B2 | 9/2004 | Shafer et al. | |
| 6,829,813 B2 | 12/2004 | Zennamo, Jr. et al. | |
| 6,888,423 B2 | 5/2005 | Tresness et al. | |
| 6,986,666 B2 | 1/2006 | Benson et al. | |
| 7,023,298 B1 | 4/2006 | Palinkas et al. | |
| 7,303,439 B1 | 12/2007 | Montena | |
| 7,323,951 B2 | 1/2008 | Montena | |
| 8,545,235 B2 | 10/2013 | Montena | |
| 2002/0064014 A1 | 5/2002 | Montena | |
| 2004/0057186 A1 | 3/2004 | Chawgo | |
| 2004/0085156 A1 | 5/2004 | Olcen et al. | |
| 2004/0104786 A1 | 6/2004 | Shafer et al. | |
| 2005/0086701 A1 | 4/2005 | Palinkas et al. | |
| 2005/0164525 A1 | 7/2005 | Benson et al. | |
| 2005/0282433 A1 | 12/2005 | Pixley et al. | |

FOREIGN PATENT DOCUMENTS

| | | | |
|---|---|---|---|
| WO | 2005/041553 A2 | 5/2005 | |
| WO | 2005/041553 A3 | 5/2005 | |

* cited by examiner

OUTER SLEEVE FOR CATV FILTER

PRIORITY CLAIM

This application is a continuation of, and claims the benefit and priority of, U.S. patent application Ser. No. 15/340,452, filed on Nov. 1, 2016, (now U.S. Pat. No. 10,424,893), which is a continuation of U.S. patent application Ser. No. 14/013,797, filed on Aug. 29, 2013 (now U.S. Pat. No. 9,516,774), which is a continuation of U.S. patent application Ser. No. 11/467,247, filed on Aug. 25, 2006 (now U.S. Pat. No. 8,545,235). The entire contents of such applications are hereby incorporated by reference.

FIELD OF THE INVENTION

This invention relates generally to the field of cable-television (CATV) filters, and more particularly to a torque transmitting outer sleeve for a CATV filter.

BACKGROUND

In typical CATV applications, a filter circuit or network is provided to pass signals having frequencies within one or more specified bandwidths, sometimes with a desired amount of signal attenuation, while blocking signals of other frequencies. It is convenient, but not necessary, to mount the electrical components such as capacitors, inductors, and resistors on one or more printed circuit boards in essentially conventional fashion. The circuit board carrying the filter circuit components is mounted within a suitable protective housing. Physical rigidity is required to maintain stable electrical response. Connection headers at each end provide for connecting the filter to a coaxial cable connector and to an equipment port. The entire assembly is commonly referred to as a filter or trap.

It is customary in the CATV industry for system technicians to use special wrenches for the installation and removal of traps. These special wrenches are of the pin spanner type where the driving pins of the wrench are accepted by two shallow holes bored into the end face of one header, sometimes referred to as engagement holes. This has been effective, but requires a degree of manufacturing difficulty and material usage which increases the cost of the trap housing components.

U.S. Pat. No. 5,150,087 (Yoshie et al.); U.S. Pat. No. 5,432,488 (Kotani et al.); U.S. Pat. No. 5,662,494 (Zennamo, Jr. et al.); U.S. Pat. No. 6,273,766 (Zennamo, Jr. et al.); U.S. Pat. No. 6,636,129 (Zennamo, Jr. et al.); U.S. Pat. No. 6,829,813 (Zennamo, Jr. et al.); and U.S. Pat. No. 6,888,423 (Tresness et al.) all show traps with the two engagement holes drilled into the end face of one of the headers.

SUMMARY

A torque transmitter for connecting a cable television (CATV) filter component to an interface port is disclosed. The torque transmitter includes a CATV filter header configured to support the CATV filter component. The torque transmitter also includes a torque-transmitting housing configured to at least partially house the CATV filter header. The torque-transmitting housing includes an end face portion facing away from the interface port. The end face portion defines an engagement hole therein. The engagement hole is configured to receive a protrusion of a torque-transmitting portion of a CATV filter installation tool. The torque-transmitting housing is configured to receive a torque force from the CATV filter installation tool, and to transmit the torque force to the CATV filter header, so as to allow the CATV filter installation tool to connect the CATV filter component to the interface port.

In another embodiment, the torque transmitter includes a CATV filter header configured to support the CATV filter component. The torque transmitter also includes a torque-transmitting housing configured to at least partially at least partially surround the CATV filter header. The torque-transmitting housing includes an end face portion configured to receive a CATV filter installation tool. The torque-transmitting housing is configured to receive a torque force from the CATV filter installation tool when the end face portion receives the CATV filter installation tool, and to transmit the torque force to the CATV filter header so as to allow the CATV filter installation tool to connect the CATV filter component to the interface port.

In another embodiment, the torque transmitter includes a filter header configured to support a filter component. The torque transmitter also includes a torque-transmitting housing configured to at least partially enclose the filter header. The torque-transmitting housing is configured to receive a torque force from an installation tool, and to transmit the torque force to the filter header.

DETAILED DESCRIPTION OF THE PREFERRED EMBODIMENT

Figure 1:
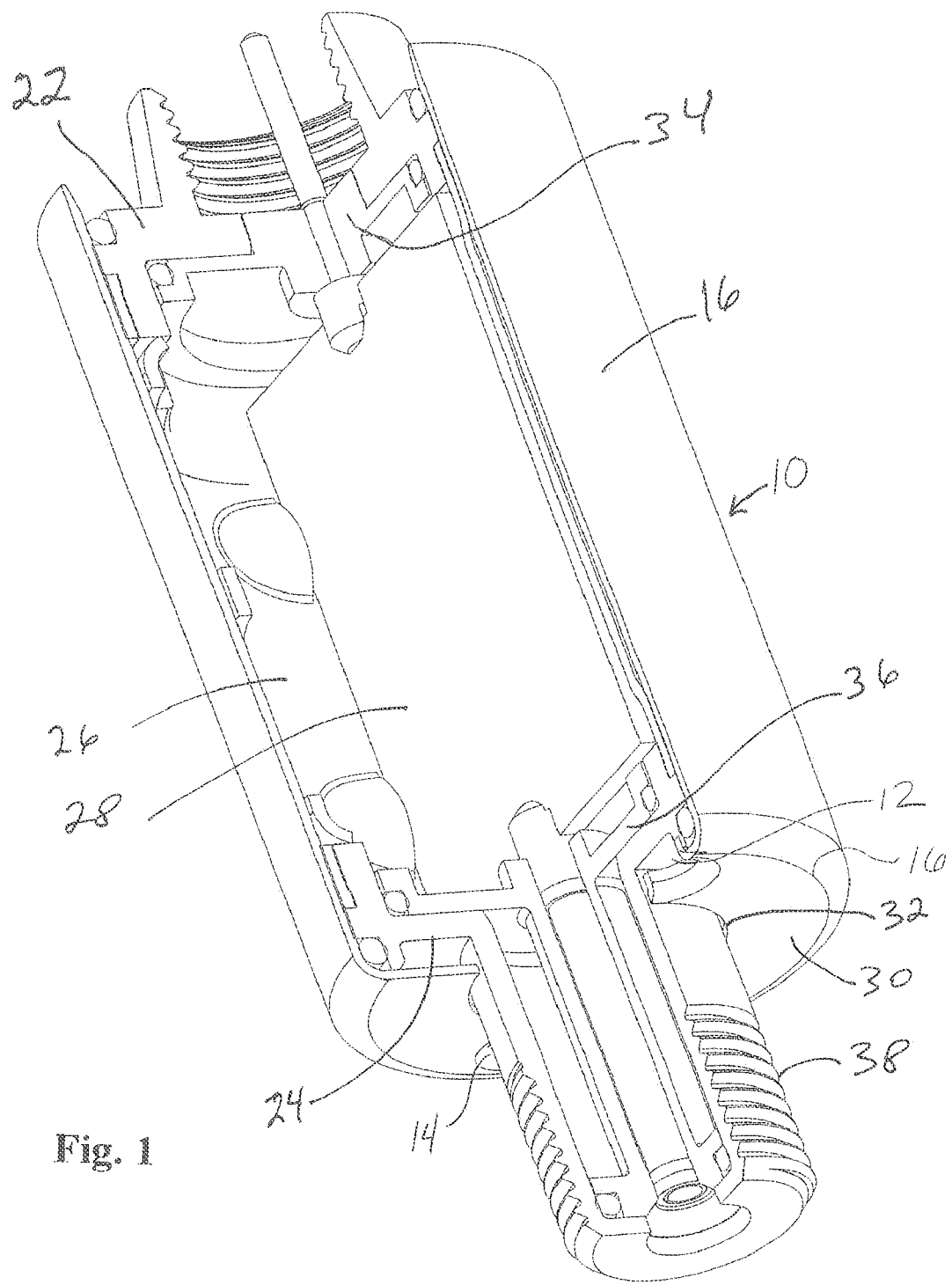
FIG. 1 shows a cutaway perspective view of a filter with a housing according to an embodiment of the present invention.
Figure 2:
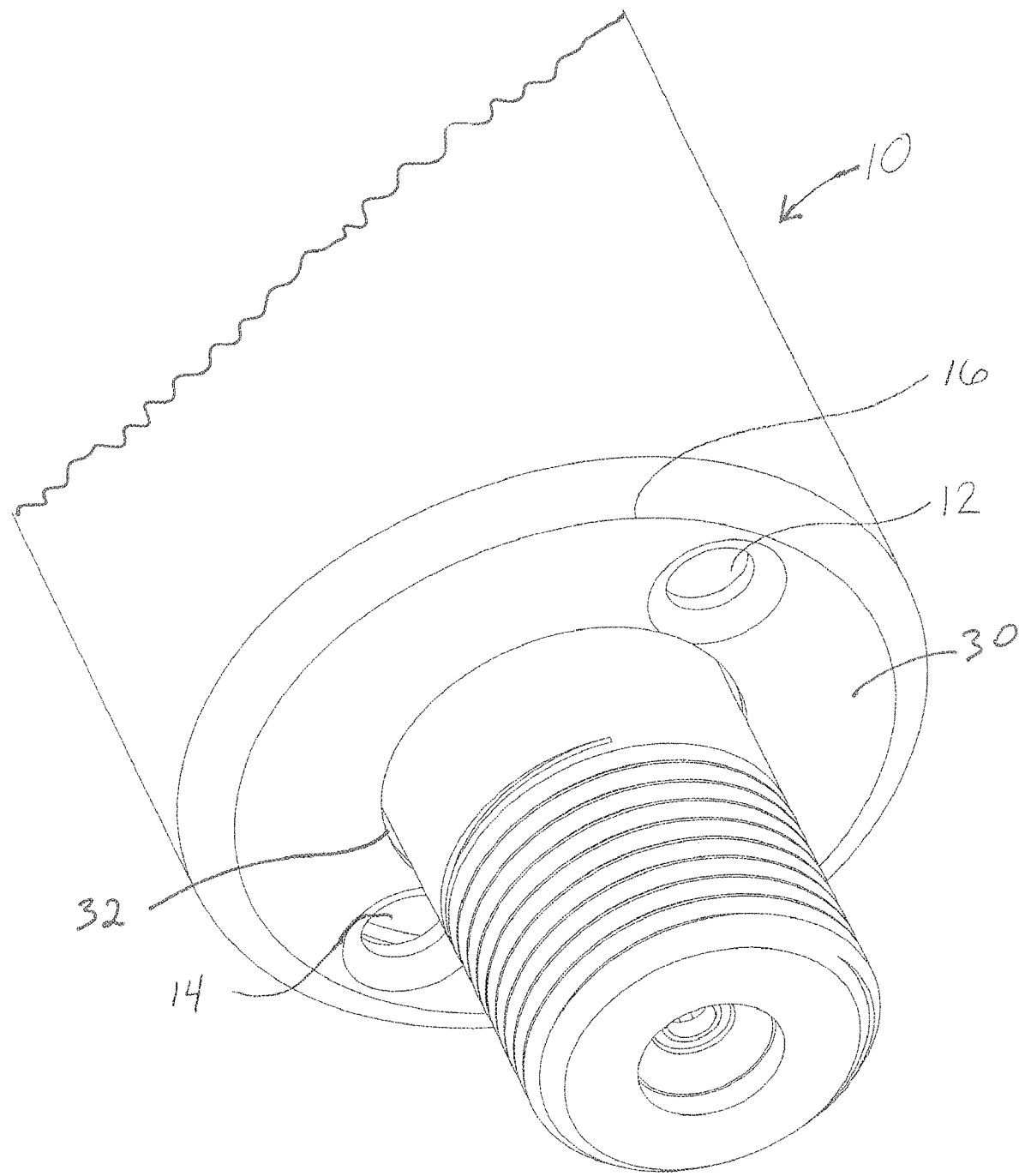
FIG. 2 shows a perspective view of the housing of the embodiment of FIG. 1 with two engagement holes shown.
Figure 3:
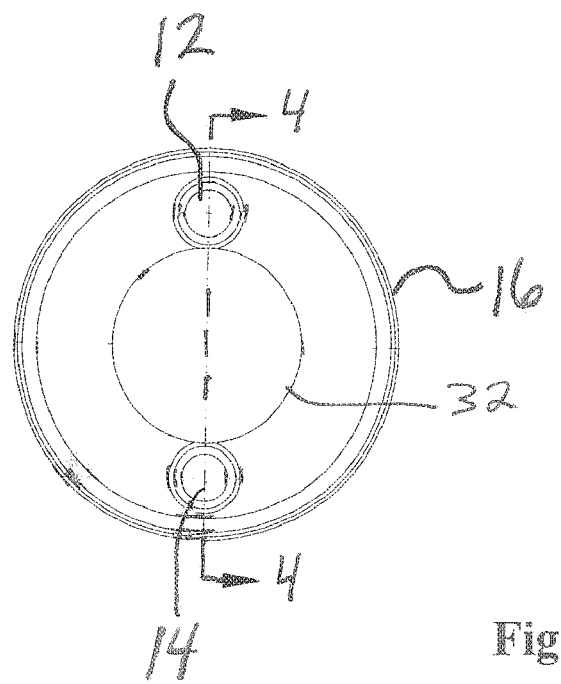
FIG. 3 shows a front elevation view of the embodiment of FIG. 1.
Figure 4:
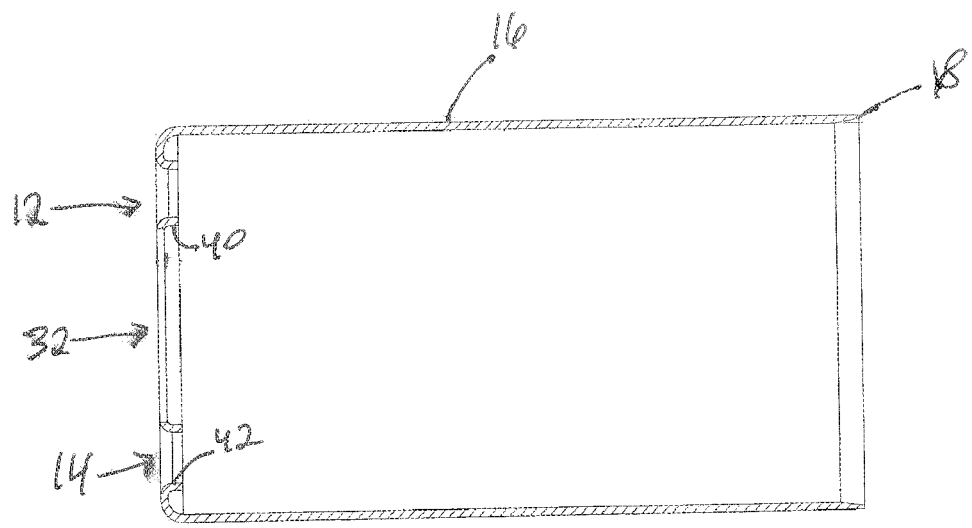
FIG. 4 shows a cross-sectional view taken across line 4-4 of FIG. 3.

Referring to FIGS. 1-4, a CATV filter 10 includes a circuit board 28 connected to an inner frame 26. At one end of filter 10, an insulator 34 is adjacent to one end of circuit board 28 and is held in place partly by a header 22, while at another end of filter 10, an insulator 36 is adjacent to another end of circuit board 28 and is held in place partly by a header 24. An outer sleeve, also known as a housing, 16 fits over inner frame 26 and headers 22, 24 holding the assembly together. A portion of header 22 is shaped to connect to an equipment port (not shown), while a portion of header 24 is shaped to connect to a coaxial cable (not shown) via a coaxial cable connector (not shown), and in particular, includes a threaded connector 38.

Outer sleeve 16 includes a central hole 32 in a face 30 to accommodate threaded connector 38. Outer sleeve 16 also includes two engagement holes 12, 14 to accommodate the driving pins (not shown) of the special pin spanner-type wrench (not shown) which is used in the industry to screw filters and traps onto equipment ports. Outer sleeve 16 is preferably of stainless steel, which is comparable to brass in terms of durability. When fabricating outer sleeve 16 of stainless steel, the part is deep drawn, which means that it starts out as steel sheet and is successively stamped into ever deeper and narrower "soup cans" until the final diameter and length are reached. The bottom end is closed, while the top end is still attached all the way around the rim to the parent sheet.

Engagement holes 12, 14 are then formed in face 30 by punching two small holes in the bottom of the partially formed outer sleeve, after which a larger diameter tapered pin is forced through the holes, pushing the edge inward and stretching the diameter of each engagement hole 12, 14 to its final diameter. Central hole 32 is then punched out, after which the part is sheared off the parent sheet and the edge is compacted in an operation known as a "pinch trim" which tapers edge 18 while eliminating the sharp edge left from the shearing. The taper of edge 18 is preferably approximately 15 degrees to aid in fitting outer sleeve 16 over inner frame 26 and headers 22, 24.

Engagement holes 12, 14 are "drifted" holes, meaning that they have curled-in edges 40, 42, respectively, as a result of how they were made. Simply die-punching engagement holes 12, 14 would not add curled edges 40, 42 to engagement holes 12, 14. The strength of the "drifted" edge of the holes, combined with the durability of the stainless steel base metal, makes engagement holes 12, 14 comparable in performance to drilled holes in brass. Curled edges 40, 42 add effective thickness to engagement holes 12, 14 which is greater than the thickness of the sheet metal itself, thus providing structural rigidity to withstand the up to 90 in-lb of torque expected when abused, with minimal deformation of engagement holes 12, 14. Non-drifted holes actually tear under those conditions, whereas the drifted holes merely become slightly egg-shaped. In addition, the prior art method of drilling engagement holes in one header is costlier than the present method of forming engagement holes 12, 14 in outer sleeve 16.

With no engagement holes in the header, machining or casting or metal injection molding without secondary machining operations becomes possible. The material thickness of the header may also be reduced, also saving costs.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

The following is claimed:

1. A torque transmitter for connecting a cable television (CATV) filter component to an interface port, the torque transmitter comprising:
   a CATV filter header configured to support a CATV filter component;
   a torque-transmitting housing configured to at least partially house the CATV filter header, comprising an end face portion facing away from the interface port, the end face portion defining an engagement hole therein, the engagement hole being configured to receive a protrusion of a torque-transmitting portion of a CATV filter installation tool;
   wherein the torque-transmitting housing is configured to receive a torque force from the CATV filter installation tool, and to transmit the torque force to the CATV filter header, so as to allow the CATV filter installation tool to connect the CATV filter component to the interface port; and
   wherein the end face portion comprises a curled portion that at least partially defines the engagement hole.

2. The torque transmitter of claim 1, wherein the CATV filter header is not configured to engage the CATV filter installation tool.

3. The torque transmitter of claim 1, wherein the CATV filter header does not include an engagement hole that is configured to receive the CATV filter installation tool.

4. The torque transmitter of claim 1, wherein the curled portion comprises a substantially annular extension that extends inward from the end face portion in a direction that is substantially parallel to a central longitudinal axis of the torque-transmitting housing so as to increase a thickness of the engagement hole.

5. A torque transmitter for connecting a cable television (CATV) filter component to an interface port, the torque transmitter comprising:
   a CATV filter header configured to support a CATV filter component; and
   a torque-transmitting housing configured to at least partially surround the CATV filter header, comprising an end face portion configured to receive a CATV filter installation tool, and
   wherein the torque-transmitting housing is configured to receive a torque force from the CATV filter installation tool when the end face portion receives the CATV filter installation tool, and to transmit the torque force to the CATV filter header so as to allow the CATV filter installation tool to connect the CATV filter component to an interface port; and
   wherein the end face portion comprises a curled portion.

6. The torque transmitter of claim 5, wherein the CATV filter header is not configured to engage the CATV filter installation tool.

7. The torque transmitter of claim 5, wherein the CATV filter header does not include an engagement hole that is configured to receive the CATV filter installation tool.

8. The torque transmitter of claim 5, wherein the curled portion at least partially defines an engagement hole that is configured to receive a protrusion of the CATV filter installation tool.

9. A torque transmitter comprising:
   a filter header configured to support a filter component;
   a torque-transmitting housing configured to at least partially enclose the filter header;
   wherein the torque-transmitting housing is configured to receive a torque force from an installation tool, and to transmit the torque force to the filter header; and
   wherein the torque-transmitting housing comprises a curled portion that is configured to receive the installation tool.

10. The torque transmitter of claim 9, wherein the torque-transmitting housing is configured to transmit the torque force to the filter header so as to install the torque transmitter on an interface port.

11. The torque transmitter of claim 9, wherein the torque-transmitting housing is configured to transmit the torque force to the filter header so as to install the filter component on an interface port.

12. The torque transmitter of claim 9, wherein the filter header is not configured to receive the installation tool.

13. The torque transmitter of claim 9, wherein the filter header does not include an engagement hole that is configured to receive the installation tool.

14. The torque transmitter of claim 9, wherein the torque-transmitting housing comprises an end face portion facing away from an interface port, and wherein the end face portion comprises the curled portion.

15. The torque transmitter of claim 9, wherein the curled portion comprises a substantially annular extension that extends inward from the end face portion in a direction that is substantially parallel to a central longitudinal axis of the torque-transmitting housing.

16. The torque transmitter of claim 9, wherein the curled portion at least partially defines an engagement hole that is configured to receive a protrusion of the installation tool.

17. The torque transmitter of claim 16, wherein a central longitudinal axis through the filter header is aligned with a central longitudinal axis through the torque-transmitting housing, and wherein a central longitudinal axis through the engagement hole is radially-offset from the central longitudinal axes through the filter header and the torque-transmitting housing.

18. The torque transmitter of claim 9, wherein the filter header comprises a threaded connector that is configured to connect to an equipment port or a coaxial cable.

19. A torque transmitter for connecting a cable television (CATV) filter component to an interface port comprising:
  a CATV filter header configured to support a CATV filter component;
  a torque-transmitting housing configured to at least partially house the CATV filter header;
  wherein the torque-transmitting housing is configured to transmit a torque force received by an installation tool to the CATV filter header so as to allow the installation tool to connect the CATV filter component to an interface port; and
  wherein the torque-transmitting housing includes an end face defining a curled edge portion that is configured to receive the installation tool to allow the torque-transmitting housing transmit a greater torque force from the installation tool to the CATV filter than a torque-transmitting housing that does not include the curled edge portion.

20. The torque transmitter of claim 19, wherein the end face portion is configured to face away from the interface port and define an installation tool engagement hole.

21. The torque transmitter of claim 20, wherein the installation tool engagement hole is configured to receive a protrusion of a torque-transmitting portion of the installation tool.

22. The torque transmitter of claim 21, wherein the curled edge portion is configured to at least partially define the installation tool engagement hole so as to allow the torque-transmitting housing to transmit the greater torque force from the installation tool to the CATV filter than the torque-transmitting housing that does not include the curled edge portion.

23. A torque transmitter for connecting a cable television (CATV) filter component to an interface port comprising:
  a CATV filter header configured to support a CATV filter component;
  a torque-transmitting housing configured to at least partially house the CATV filter header;
  wherein the torque-transmitting housing is configured to transmit a torque installation force from a installation tool to the CATV filter header that is sufficient to allow the installation tool to connect the CATV filter component to an interface port; and
  wherein the torque-transmitting housing includes an end face defining a curled edge portion that is configured to receive the installation tool to allow the torque-transmitting housing to transmit a greater torque installation force from the installation tool to the CATV filter than a torque-transmitting housing that does not include the curled edge portion.

24. The torque transmitter of claim 23, wherein the end face portion is configured to face away from the interface port and define an installation tool engagement hole.

25. The torque transmitter of claim 24, wherein the installation tool engagement hole is configured to receive a protrusion of a torque-transmitting portion of the installation tool.

26. The torque transmitter of claim 25, wherein the curled edge portion is configured to at least partially define the installation tool engagement hole so as to allow the torque-transmitting housing to transmit the greater torque force from the installation tool to the CATV filter than the torque-transmitting housing that does not include the curled edge portion.

* * * * *